United States Patent [19]
Devine et al.

[11] 4,123,669
[45] Oct. 31, 1978

[54] LOGICAL OR CIRCUIT FOR PROGRAMMED LOGIC ARRAYS

[75] Inventors: William T. Devine, Ulster Park; William F. Washburn, Hyde Park, both of N.Y.

[73] Assignee: International Business Machines Corporation, Armonk, N.Y.

[21] Appl. No.: 831,582

[22] Filed: Sep. 8, 1977

[51] Int. Cl.² ............... H03K 19/08; H03K 19/30; H03K 17/04; G06F 9/00
[52] U.S. Cl. .................. 307/205; 307/207; 307/218; 307/251; 364/716
[58] Field of Search .......... 307/203, 205, 207, 213, 307/218, 251; 364/716

[56] References Cited

U.S. PATENT DOCUMENTS

| | | | |
|---|---|---|---|
| 3,566,153 | 2/1971 | Spencer, Jr. | 307/205 |
| 3,601,627 | 8/1971 | Booher | 307/205 |
| 3,678,293 | 7/1972 | Popper | 307/205 X |
| 3,816,725 | 6/1974 | Greer | 307/207 X |
| 3,974,366 | 8/1976 | Hebenstreit | 307/205 X |
| 3,975,623 | 8/1976 | Weinberger | 307/207 X |
| 4,025,799 | 5/1977 | Cox et al. | 307/207 |
| 4,032,894 | 6/1977 | Williams | 307/205 X |
| 4,037,089 | 7/1977 | Horninger | 307/207 X |
| 4,065,736 | 12/1977 | London | 307/205 X |
| 4,084,152 | 4/1978 | Long et al. | 364/716 X |

OTHER PUBLICATIONS

Wood, "High-Speed Dynamic Programmable Logic Array Chip"; IBM Journal of Res. & Development, pp. 379-383; vol. 19, No. 4, 7/1977.
Elder et al., IBM Tech. Discl. Bull., vol. 19, No. 7, pp. 2632-2633, 12/1976.
Moore, IBM Tech. Discl. Bull., vol. 9, No. 6, pp. 698-699, 11/1966.
Cook, IBM Tech. Discl. Bull., vol. 20, No. 4, pp. 1640-1641, 9/1977.

Primary Examiner—Larry N. Anagnos
Attorney, Agent, or Firm—Karl O. Hesse

[57] ABSTRACT

An improved logical OR circuit is shown wherein the load resistance is divided into drain resistance and source resistance, each resistance having a lower value than could be employed with a single load resistance while at the same time keeping power dissipation to low levels. The use of relatively lower resistances permits faster voltage rise time, thereby permitting faster programmed logic array (PLA) operation. The voltage drop across the source resistance is made small when the output device is conducting by providing a substantially higher drain resistance load for the output device with respect to the drain resistance of the input devices.

5 Claims, 3 Drawing Figures

LOGICAL OR CIRCUIT FOR PROGRAMMED LOGIC ARRAYS

BACKGROUND OF THE INVENTION

In the static logic OR arrays of prior art programmed logic arrays (PLA's) such as shown in FIG. 2 of U.S. Pat. No. 3,566,153, the sources of OR array input devices Q11 through Qmk are connected to ground reference potential. In order to provide reasonably fast voltage rise time at the drains of all of the input devices which are connected together at Sp1, Sp2, etc. and have large parasitic capacitance, the resistive load 15 must have low impedance. When the resistive load has low impedance, all of the array input devices must be fabricated with wide channel areas so that even lower resistance is provided by an input device Qmk in order to reliably turn off the next circuit stage device when desired. Thus, large silicon areas and high currents are consummed.

Another patent showing the same general configuration but with differing voltage polarities and source drain connections is U.S. Pat. No. 3,816,725. The circuit arrangement of this patent also consumes relatively large chip areas and power.

It is known that the use of phase clock switched load resistances decreases power consumption. FIG. 1 of U.S. Pat. No. 3,601,627 is an example of general purpose dynamic logic circuit having switched charging and discharging devices 1 and 14 respectively. FIG. 2 of U.S. Pat. No. 3,974,366 shows an application of switched load resistances to programmable logic arrays. A complete explanation of a PLA designed using clocked phase controlled resistances, also called dynamic logic circuits, is shown particularly in FIG. 2 of "High Speed Dynamic Programmable Logic Array Chip" by R. S. Wood, in IBM Journal of Research and Development, Vol. 19, No. 4, July 1975 beginning at page 379. Although the power dissipation of the dynamic logic circuits of U.S. Pat. No. 3,974,366 is somewhat improved, a significant time delay is introduced by the need to prevent invalid signals generated during precharging of the AND array output lines 111, 131 from energizing OR array input devices 24, 25, 26 while the OR array output nodes 211, 231 are being precharged. This external clocking can be provided between arrays by blocks 3 and 4 as shown in U.S. Pat. No. 3,974,366, but such placement between arrays complicates design of multiple AND array PLA configurations such as taught in FIG. 3 of U.S. Pat. No. 3,975,623.

Another example prior art teaching is U.S. Pat. No. 3,678,293. This patent shows devices L4 and Q4 which provide reliable switching of device Q3 by raising its source potential to compensate for voltage drops across diffusion and other distributed impedances designated as R1. There is no teaching directed to reduction of current through Q3 or reduction of the size of Q3. This patent is a good example of an alternate embodiment for inverter devices 41 and 42 of FIG. 1 in the instant specification.

SUMMARY OF THE INVENTION

It is a primary object of the invention to obtain the advantages of a static logic OR array circuit while avoiding the aforementioned disadvantages of high power consumption and large chip area requirements, while at the same time improving switching speed.

It is a further object of the invention to provide a static logic OR circuit for use in the OR array of a programmed logic array having a relatively high effective load resistance when input devices are conducting so as to keep power consumption low and having a relatively lower load resistance when input devices are switching to a non-conducting state so as to allow fast voltage rise at the drains of the input devices.

These and other objects of the invention are accomplished by splitting the effective load resistances known in the prior art into a source load resistance 312 and a drain load resistance 315. Both source and drain load resistances 312 and 315 are effectively connected in series when any one of the OR array input devices 301, 302, 303 are conducting but the capacitance 323 of node 320 is effectively to a higher voltage by device 315 acting alone which provides an effectively lower resistance.

Further effective change in load resistance 315 is provided by feedback device 317 and load resistance 319. The voltage applied by load resistance 319 further decreases the resistance of load device 315 when the input devices 301, 302, 303 are turning off.

DESCRIPTION OF THE PREFERRED EMBODIMENT

Figure 1:
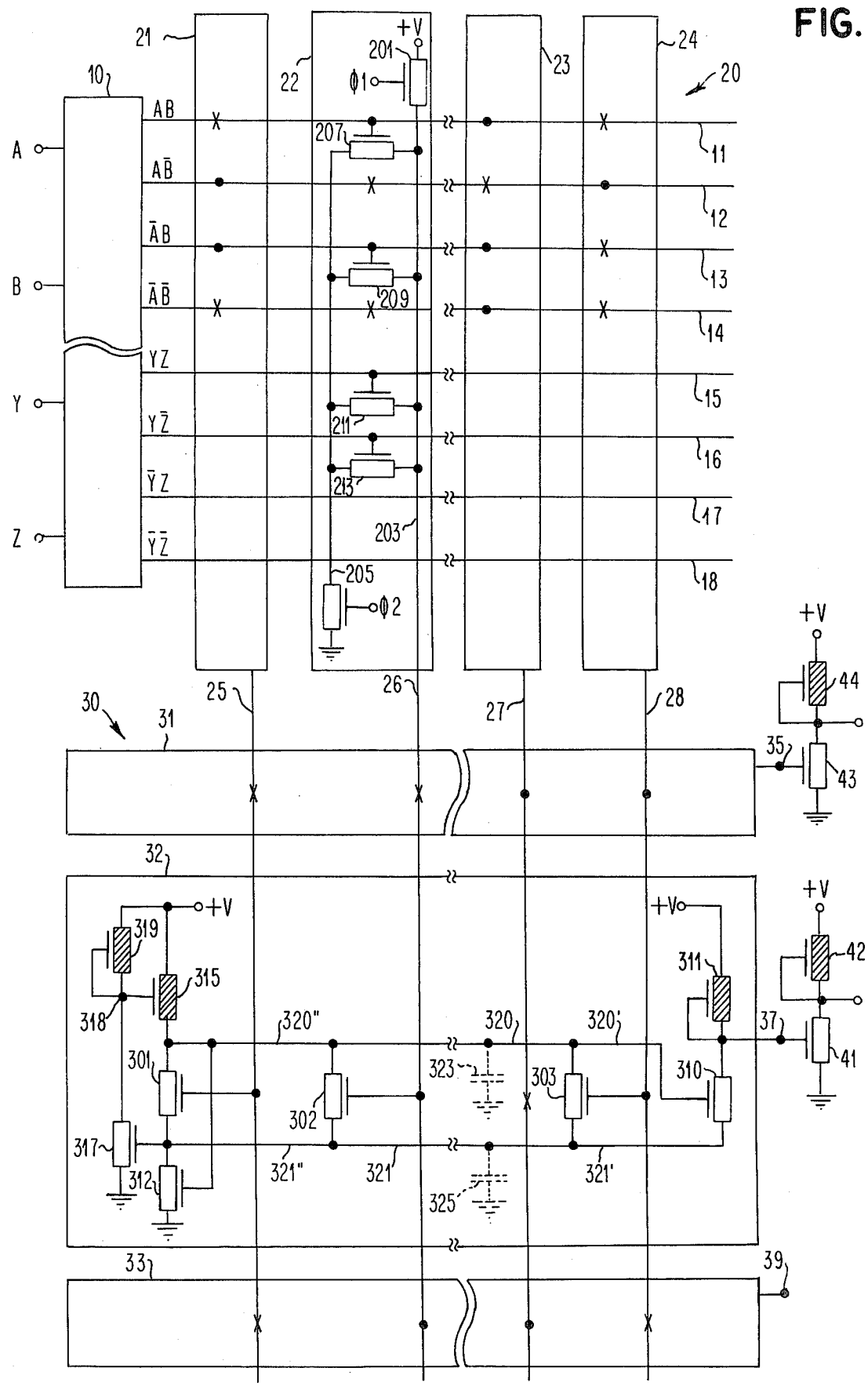
FIG. 1 is a circuit diagram of a programmed logic array incorporating the invention.

Reference is now made to FIG. 1 which illustrates a programmed logic array (PLA) as an example of making and using applicants' invention. Bit partitioning input circuits 10 are shown in block diagram form, the details of which are more fully set out in U.S. Pat. Nos. 3,593,317 and 3,924,243. The outputs 11-18 of bit partitioning circuits 10 are provided to AND array 20 which includes at least AND gates 21, 22, 23 and 24. The detailed circuitry of AND gate 22 is shown as an example of the circuit details of each of the AND gates in AND array 20.

During clock phase 1, unconditional pre-charging device 201 charges drain diffusion rail 203 to substantially +V minus a FET threshold voltage drop of approximately 0.5 volts.

During phase clock 2, discharging device 205 provides a series path for discharging the intrinsic capacitance of drain diffusion 203 through any one of AND gate input devices 207, 209, 211, 213 which have a positive voltage level signal at their gate metalization. Input devices 207, 209, 211 and 213 are fabricated between a source diffusion rail 215 and a drain diffusion rail 203 spaced apart to define a channel region therebetween and having thin oxide insulating each device channel region from its input line 11 through 18 which also serves as its gate metalization. In those positions within AND array 20 where an input device is not desired, thick oxide is provided between the input line and the channel region. Thick oxide is designated by an "X" in FIG. 1 and thin oxide is designated by a circular dot representing the logical signal connections. Further details of fabrication techniques relating to FET arrays are shown in U.S. Pat. Nos. 3,611,437 and 3,991,408.

The outputs of AND array 20 appear at lines 25 through 28 which are the input lines to OR array 30. OR array 30 comprises OR gates 31, 32 and 33. The circuit details of gate 32 are shown as exemplary of each of the OR gates in array 30. As in AND array 20, the input devices 301, 302, 303 of OR array 32 are created between source diffusion rail 321 and drain diffusion rail 320 which are spaced apart to define a channel region. Again, input devices are created by providing thin oxide represented by a dot between the input line metalization and the channel region. For example, the metalization of input line 25 acts as the gate metalization for input field effect transistor 301.

The drain diffusion rail connecting and embodying the drain of each of the input transistors 301, 302, 303 is connected to the first load device 315 and the gate of output device 310 as well as the gate of a second load device 312. Input source diffusion rail 321 is connected to the drain of second load device 312 and the source of output switching device 310. The drain of output switching device 310 is connected to the output of gate 32 as well as to a third load device 311.

Load devices 42, 44, 311, 315, and 319 are fabricated as depletion mode FET devices in this preferred embodiment. The effect of utilizing depletion mode in contrast with enhancement mode is to shift the gate voltage threshold down by approximately 3 volts. In other words, an enhancement device begins to turn on when its gate voltage rises to approximately 1 volt or more positive with respect to its source and therefore is cut off when its gate voltage equals its source voltage. A depletion mode device on the other hand begins to turn on when its gate voltage rises to approximately 2 volts or less negative with respect to its source and therefore a depletion mode device is biased well into its active region when its gate voltage equals its source voltage.

Because drain diffusion 320 and source diffusion 321 are relatively long and include many input devices, only three of which are shown to avoid needlessly large drawings, these diffusions have large distributed parasitic capacitances shown as capacitors 323 and 325 respectively. Capacitors 323 and 325 include gate to drain, gate to source, drain to source and other parasitic capacitances shown as equivalent capacitance to ground. The length of diffusions 320 and 321 also mean that their resistances are no longer negligible and so right-most nodes 320', 321' and left-most nodes 320" and 321" are defined for purposes of discussing circuit voltages with reference to FIGS. 2 and 3.

Improved operation of the OR gate 32 is provided by adding feedback sensing device 317 which has its gate connected to source diffusion rail 321 and its source connected to ground. The drain of feedback device 317 is connected to the gate of load device 315 and to the relatively smaller fourth load device 319.

The output of each OR circuit 31, 32, 33 is connected to the next logic circuit which may, for example, be an inverter. Switching devices 41 and 43 connected to load devices 42, and 44 are exemplary inverters. The ratio of the channel area of switching devices 41, 43 is made larger with respect to load devices 42, 44 so that switching devices 41, 43 reduce the voltage at their drains to a substantially down binary level even though the input voltage to switching devices 41, 43 is slightly higher than it would have been without the insertion of the second load resistance 312. In view of the fact that the second load resistance device 312 and the switching device 310 both are rendered conductive by drain diffusion rail 320, it can be seen by reference to FIG. 2 that the down binary level of the output 35, 37, 39 of each OR array is approximately 0.5 volts.

OPERATION OF THE PREFERRED EMBODIMENT

Figure 2:
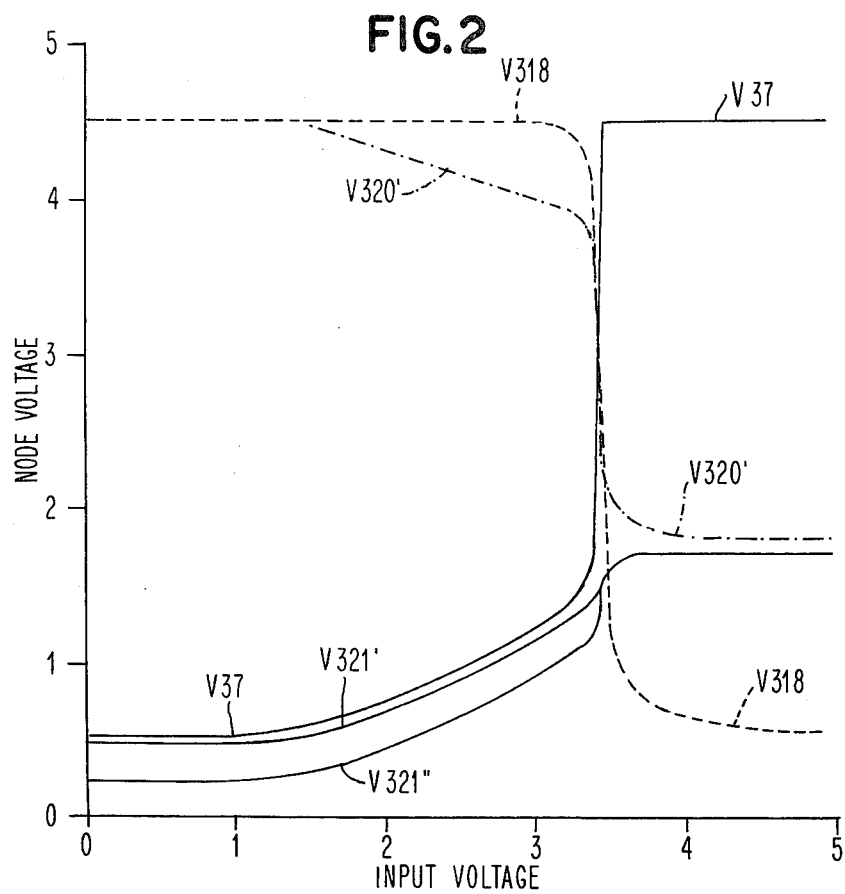
FIG. 2 is a plurality of wave forms showing the DC operation of the OR array circuit 32 as a function of input voltage at any one of the input devices, the other input devices remaining non-conducting.

With the description of OR gate 32 in mind, its operation will now be described with reference to FIGS. 2 and 3. FIG. 2 includes several wave forms at the significant nodes within the circuit 32 as a function of input voltage at one of the input devices such as device 303. As the voltage on input line 28 slowly increases, at approximately 1.5 volts, device 303 begins to turn on. This change can be seen in the drop of voltage at node 320' labeled V320' and the rise in the voltage at node 321' and 321". Node 321' and 321" are substantially the same with the exception that source diffusion 321 includes some resistance, therefore, at the left-most end of source diffusion 321, the voltage is lower than at the right-most end designated as 321'. When the voltage at input line 28 reaches approximately 3.5 volts, input device 303 exhibits less than 0.5 volt drop from drain to source which causes the voltage at node 320' labeled V320' to drop precipitously with respect to the voltage at 321' so that output device 312 is turned off. Current through input device 303 is further limited by the drop in voltage V318 at node 318 caused by feedback FET device 317 which increases its conduction due to the rise in voltage at node 321 thereby reducing the gate to source voltage of load FET device 315.

Figure 3:
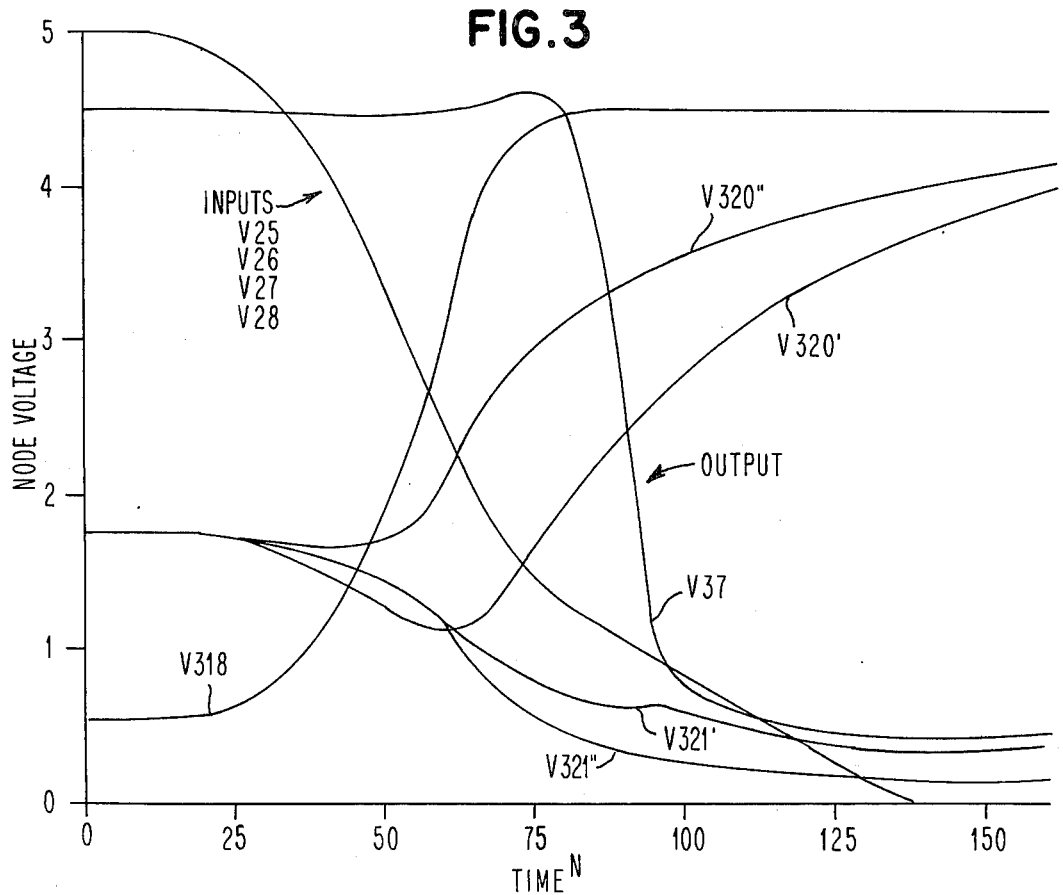
FIG. 3 shows a plurality of wave forms as a function of time indicating the transient response at various nodes of the circuit 32, to falling input wave forms at the OR array input devices.

Referring now to FIG. 3, the AC or transient operation of the circuit of the invention will be explained in more detail. The large number of OR gate input devices 301, 302, 303 and the substantial length of drain diffusion 320 and source diffusion 321 create very large capacitive loads distributed along these diffusions, represented as parasitic drain capacitance 323 and parasitic source capacitance 325. The worst case transient delay occurs when a large number of input devices are acting in parallel. In this case, the parasitic capacitances 323 and 325 are largest and the initial gate to source voltage of the output device 310 is near zero volts. To further impose worst case conditions the drain supply voltage $+V$ is assumed to be at its negative tolerance of $+4.5$ volts, the voltage of the substrate is assumed to be at its positive tolerance of $-4.5$ volts and the input signals on lines 25, 26, 27, 28 from the AND array are considered to be at their positive tolerance of $+5$ volts. A study of FIG. 3 clearly brings out the advantages of applicants' circuit which provides an effectively high resistance load for low power dissipation but switches to lower impedance for quickly charging capacitance 323 and discharging capacitance 325, of drain and source diffusions respectively, as the input signal voltage begins to drop. For example, note that after only 25 nanoseconds, the voltage V318 at node 318 begins to rise in response to the drop in voltage caused at node 321 by the increased resistivity of input devices 301, 302, 303 as input signals begin falling. The substantial rise in voltage V318 at node 318 between 25 and 75 nanoseconds dramatically lowers the resistivity of load device 315 causing voltage wave form V320" at node 320" to change from a dropping to a fast rising RC wave form. Of course, the resistivity of drain diffusion 320 causes some delay in the rise time of wave form V320' at the rightmost end 320' of the drain diffusion. However, since the source diffusion continues to drop in voltage, the difference between the drain diffusion voltage V320' and the source diffusion V321' at 75 nanoseconds exceeds a FET threshold voltage and therefore, output switching device 310 begins to turn on after only 75 nanoseconds.

Although applicants' invention has been described in a detailed embodiment, it will be understood by those skilled in the art that various changes in form and detail, in addition to those already suggested, may be made without departing from the spirit and scope of the invention.

What is claimed is:

1. A binary logical OR circuit comprising:
   a plurality of input switching devices, each of said input devices being connected between a first node and a second node for providing a low resistance path between said first node and said second node when a binary logic signal is received at a control input of any one of said input devices;
   a first non-linear load connected between a voltage source and said first node and a second load connected between a reference voltage and said second node, said second load having a control input connected to said first node to render said second load less conductive when any one of said plurality of input devices is providing said low resistance path;
   a third load connected between said voltage source and an output node, and a output switching device connected between said output node and said second node, said output device having a control input connected to said first node for substantially increasing the resistance of said output device whenever any one of said input devices is providing a low resistance path between said first node and said second node;
   whereby said third load is allowed to provide an output signal in response to a signal received at a control input of any one of said input devices.

2. The logical OR circuit of claim 1 further comprising:
   a fourth load connected between said voltage source and a control input of said first load device;
   a feedback switching device connected between said control input of said first load device and said reference voltage, said feedback device having a control input connected to said second node for increasing the resistance of said first load by reducing the voltage provided to said load device by said fourth load whenever the voltage at said second node is increased.

3. The logical OR circuit of claim 2 wherein said input switching devices, said output switching device, and said feedback switching device are enhancement mode field effect transistors and said first load device, said third load and said fourth load are depletion mode devices.

4. The logical OR circuit of claim 3 wherein said first node and said second node comprise elongated drain and source diffusions respectively and wherein said first load and said second load are physically located and connected near one same end of said drain and source diffusions and wherein said output switching device is located near and connected to the other ends of said drain and source diffusions.

5. The logical OR circuit of claim 1 wherein the effective resistance of said third load when said output device is conducting is at least one hundred percent greater than the effective resistance of said first load when any one of said input devices are conducting.

* * * * *